(12) United States Patent
Chen et al.

(10) Patent No.: US 12,218,285 B2
(45) Date of Patent: Feb. 4, 2025

(54) DISPLAY DEVICE

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 535 days.

(21) Appl. No.: 17/545,165

(22) Filed: Dec. 8, 2021

(65) Prior Publication Data

US 2022/0238760 A1 Jul. 28, 2022

(30) Foreign Application Priority Data

Jan. 27, 2021 (CN) .......................... 202110110824.4

(51) Int. Cl.
*H01L 33/46* (2010.01)
*H01L 27/15* (2006.01)
*H01L 33/04* (2010.01)
*H01L 33/38* (2010.01)
*H01L 33/62* (2010.01)

(52) U.S. Cl.
CPC ............ *H01L 33/46* (2013.01); *H01L 27/156* (2013.01); *H01L 33/04* (2013.01); *H01L 33/38* (2013.01); *H01L 33/62* (2013.01)

(58) Field of Classification Search
CPC ....... H01L 33/46; H01L 27/156; H01L 33/04; H01L 33/38; H01L 33/62; H01L 25/0753; H01L 33/58; H01L 25/167; H10K 59/126
See application file for complete search history.

(56) References Cited

U.S. PATENT DOCUMENTS

| | | | |
|---|---|---|---|
| 2016/0064421 A1* | 3/2016 | Oh | H01L 27/1218 257/43 |
| 2018/0033849 A1* | 2/2018 | Noh | H01L 27/124 |
| 2019/0326348 A1* | 10/2019 | Im | H01L 25/0753 |
| 2020/0152835 A1* | 5/2020 | Ko | H01L 33/38 |
| 2020/0176656 A1* | 6/2020 | Bae | H01L 25/0753 |
| 2020/0335677 A1* | 10/2020 | Ohashi | H01L 33/62 |
| 2021/0193614 A1* | 6/2021 | Lee | H01L 24/82 |

* cited by examiner

*Primary Examiner* — S M Sohel Imtiaz
(74) *Attorney, Agent, or Firm* — McClure, Qualey & Rodack, LLP

(57) ABSTRACT

A display device is provided. The display device includes a substrate, a driving layer, a light-emitting element, and a light-shielding element. The substrate has a surface. The driving layer includes a thin-film transistor. The thin-film transistor is disposed on the surface. The light-emitting element has a P-end and an N-end. The light-emitting element is disposed on the driving layer and arranged in such a way that a virtual line connecting the P-end and the N-end is parallel to the surface of the substrate. The light-shielding element is disposed between the light-emitting element and the thin-film transistor for blocking a light emitted from the light-emitting element from irradiating the thin-film transistor.

18 Claims, 11 Drawing Sheets

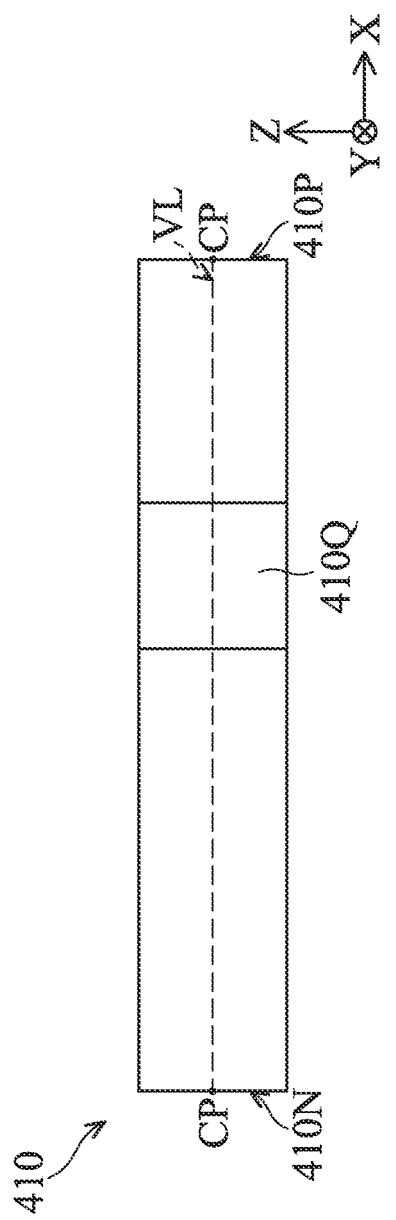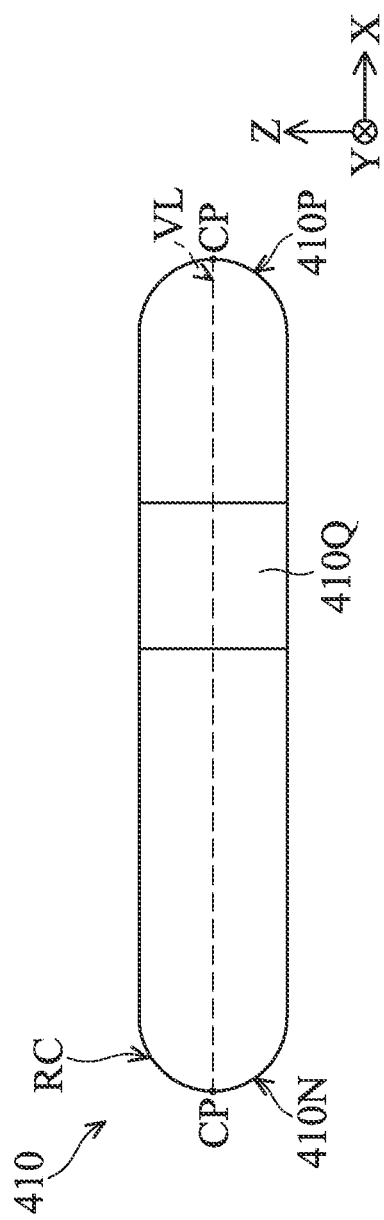

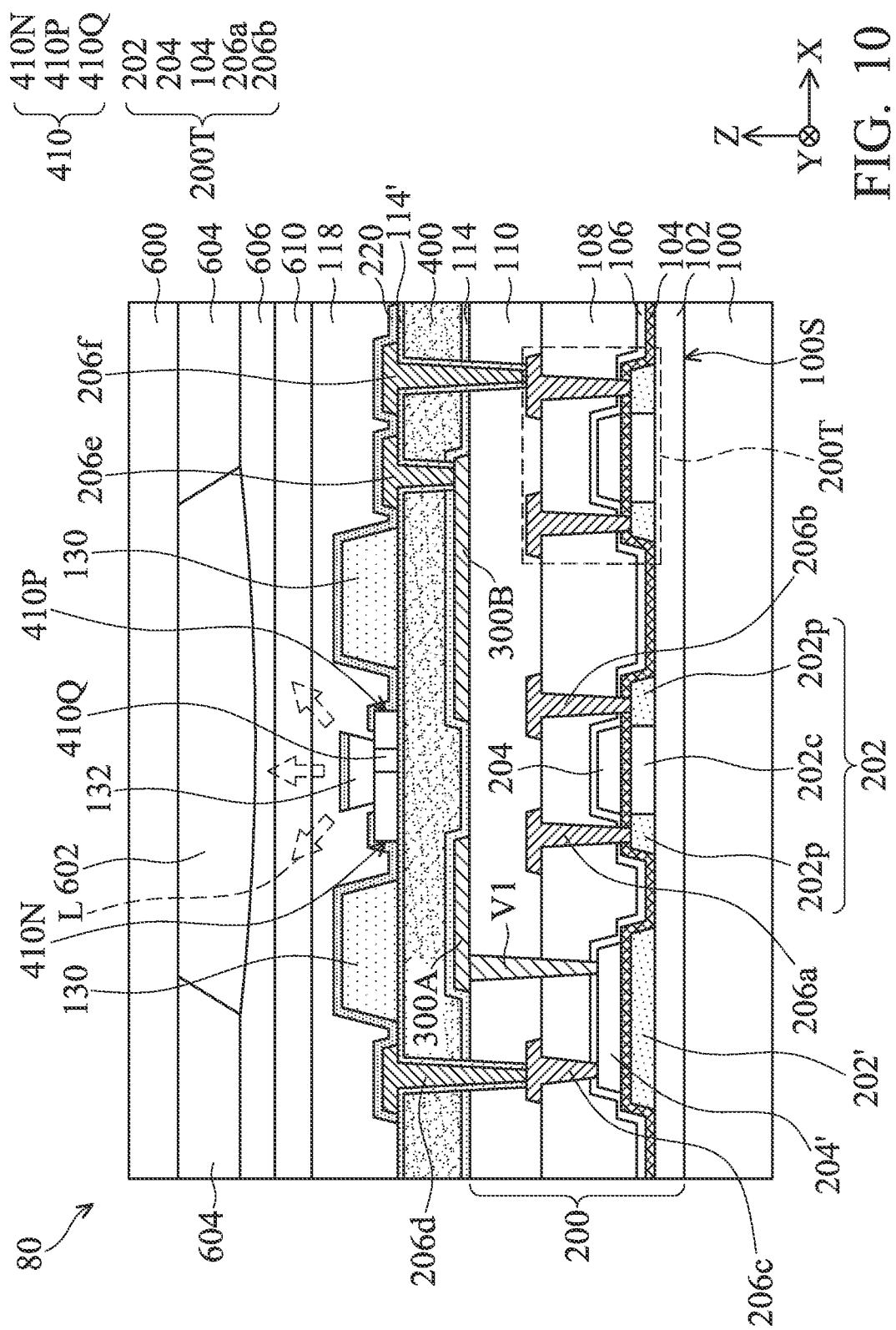

DISPLAY DEVICE

CROSS REFERENCE TO RELATED APPLICATIONS

This application claims the benefit of China Application No. 202110110824.4, filed Jan. 27, 2021, the entirety of which is incorporated by reference herein.

BACKGROUND

Technical Field

The present disclosure is related to a display device, and in particular it is related to a display device including a light-shielding element.

Description of the Related Art

Electronic products including display panels, such as smartphones, tablet computers, notebook computers, monitors, and televisions, have become indispensable necessities in modern society. With the flourishing development of such portable electronic products, consumers have high expectations for the quality, function, or price of these products.

Due to the miniaturization of light-emitting elements, some display devices adopt electric-field-induced alignment to transfer the miniaturized light-emitting elements. In such a manner, a gap needs to be reserved between the alignment electrodes to generate an electric field. However, the gap may cause light leakage problem of the light-emitting elements. For example, light may pass through the gap to irradiate the driving element of the display device, thereby affecting the performance of the driving element.

Therefore, the development of a structural design that can improve the reliability or performance of a display device is still currently an important research topic in the industry.

SUMMARY

In accordance with some embodiments of the present disclosure, a display device is provided. The display device includes a substrate, a driving layer, a light-emitting element, and a light-shielding element. The substrate has a surface. The driving layer includes a thin-film transistor. The thin-film transistor is disposed on the surface. The light-emitting element has a P-end and an N-end. The light-emitting element is disposed on the driving layer and arranged in such a way that a virtual line connecting the P-end and the N-end is parallel to the surface of the substrate. The light-shielding element is disposed between the light-emitting element and the thin-film transistor for blocking a light emitted from the light-emitting element from irradiating the thin-film transistor.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 3A is a cross-sectional diagram of a light-emitting element of a display device in accordance with some embodiments of the present disclosure;

FIG. 3B is a cross-sectional diagram of a light-emitting element of a display device in accordance with some embodiments of the present disclosure;

FIG. 10 is a cross-sectional diagram of a display device in accordance with some embodiments of the present disclosure.

DETAILED DESCRIPTION

Figure 1:
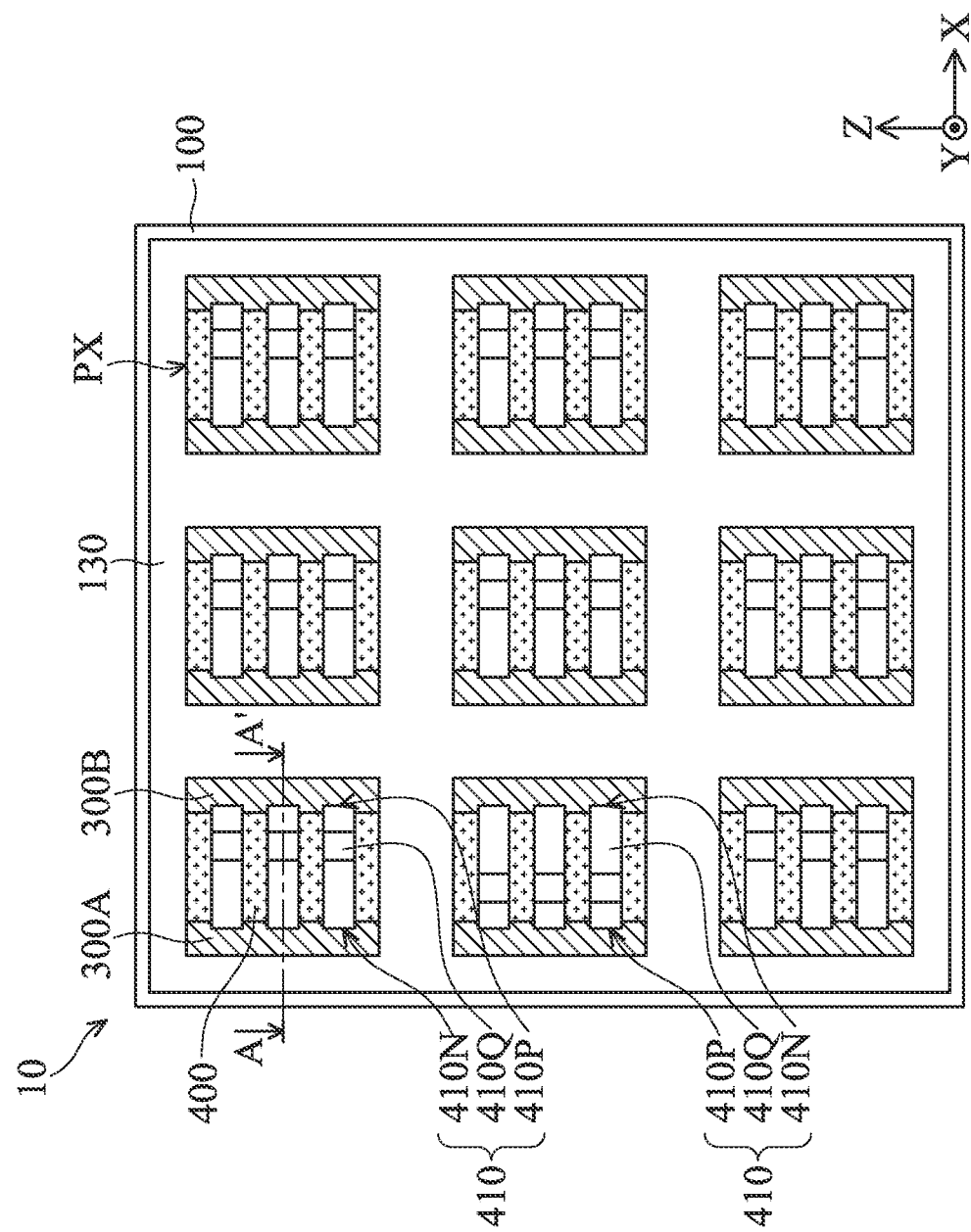
FIG. 1 is a top-view diagram of a display device in accordance with some embodiments of the present disclosure.

The display device of the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that some of the elements or devices in the drawings of the present disclosure may be present in the form or configuration known to those skilled in the art. In addition, in the embodiments, relative expressions may be used. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on/over a second material layer", may indicate that the first material layer is in direct contact with the second material layer, or it may indicate that the first material layer is in indirect contact with the second material layer, In the situation where the first material layer is in indirect contact with the second material layer, there may be one or more intermediate layers between the first material layer and the second material layer. However, the expression "the first material layer is directly disposed on/over the second material layer" means that the first material layer is in direct contact with the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. Accordingly, the first element in the specification may refer to the second element in the claims.

In accordance with the embodiments of the present disclosure, regarding the terms such as "connected", "interconnected", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected" or "electrically coupled" may include any direct or indirect electrical connection means.

In the context, the terms "about" and "substantially" typically mean+/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". The expression "in a range from the first value to the second value" or "between the first value and the second value" means that the range includes the first value, the second value, and other values in between. In addition, in the context, if the first direction is perpendicular to the second direction, the angle between the first direction and the second direction may be between 80 degrees and 100 degrees; and if the first direction is parallel to the second direction, the angle between the first direction and the second direction may be between 0 degree and 10 degrees.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined. In the specification and claims, the terms "comprising", "including", "having" and the like are open-ended phrases, so they should be interpreted as "including but is not limited to . . . ".

In accordance with some embodiments of the present disclosure, a display device is provided. The display device includes a light-shielding element disposed between a light-emitting element and a thin-film transistor. The light-shielding element can be used to block light emitted from the light-emitting element from irradiating the thin-film transistor. Therefore, the risk of photocurrent or abnormality occurring in the thin-film transistor caused by light leakage can be reduced.

The electronic device disclosed in the present disclosure may include a display device, an antenna device, a sensing device, a light-emitting device, a touch electronic device (a touch display), a curved electronic device (a curved display), or a free-shape electronic device (a free shape display), but it is not limited thereto. The electronic device may include a bendable or flexible electronic device. The electronic device may include, for example, liquid crystals, light-emitting diodes, quantum dots (QDs), fluorescence, phosphors, other suitable display media, or a combination thereof, but it is not limited thereto. The light-emitting diode may include, for example, an organic light-emitting diode (OLED), a mini light-emitting diode (mini LED), a micro light-emitting diode (micro LED), or a quantum dot light-emitting diode (quantum dot LED, including QLED, or QDLED), or other suitable materials, or a combination thereof, but it is not limited thereto. The display device may include, for example, a tiled display device, but it is not limited thereto. The antenna device may be, for example, a liquid-crystal antenna but it is not limited thereto. The antenna device may include, for example, a tiled antenna device, but it is not limited thereto. It should be noted that the electronic device can be any combination of the foregoing, but it is not limited thereto. In addition, the appearance of the electronic device may be rectangular, circular, polygonal, a shape with curved edges, or other suitable shapes. The electronic device may have peripheral systems such as a driving system, a control system, a light source system, etc., to support a display device, an antenna device, or a tiled device. Hereinafter, the display device will be used as an example to describe the electronic device of the present disclosure, but the present disclosure is not limited thereto.

Figure 2:
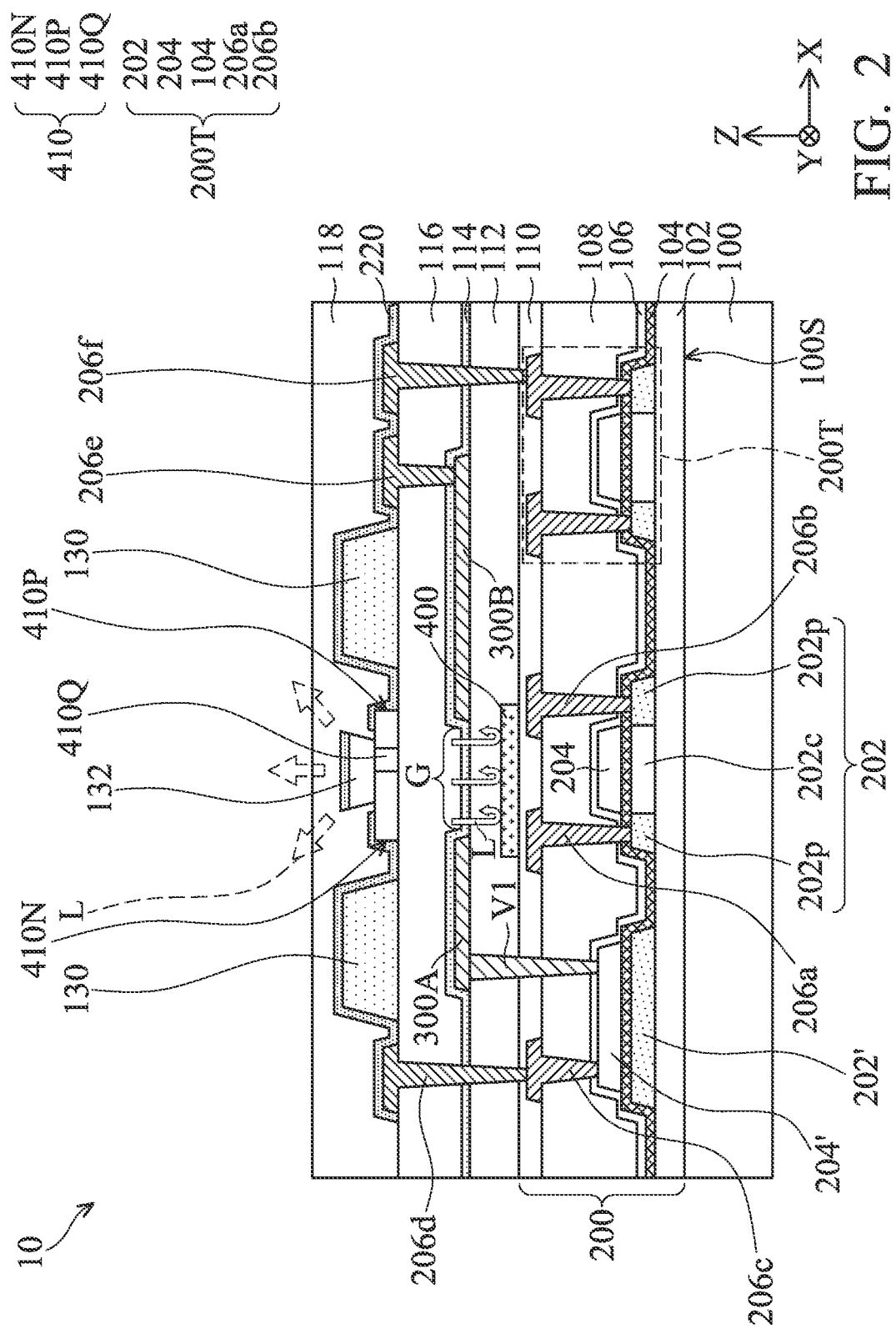
FIG. 2 is a cross-sectional diagram of a display device corresponding to section line A-A' of FIG. 1 in accordance with some embodiments of the present disclosure.

Refer to FIG. 1 and FIG. 2. FIG. 1 is a top-view diagram of a display device 10 in accordance with some embodiments of the present disclosure. FIG. 2 is a cross-sectional diagram of the display device 10 corresponding to section line A-A' of FIG. 1 in accordance with some embodiments of the present disclosure. It should be understood that, to provide a clear description, some elements of the display device 10 are omitted in the drawing, and only some elements are schematically shown. In accordance with some embodiments, additional features may be added to the display device 10 described below. In accordance with some other embodiments, some of the features of the display device 10 described below may be replaced or omitted.

FIG. 1 only illustrates the light-shielding elements 400, the light-emitting elements 410, the alignment electrodes 300A, the alignment electrodes 300B, and the insulating layer 130 of the display device 10 to clearly illustrate their positional relationship. The detailed structure of these elements will be further described in FIG. 2 below. As shown in FIG. 1, in accordance with some embodiments of the present disclosure, the display device 10 includes a substrate 100 and a plurality of sub-pixel units PX. The sub-pixel units PX are disposed on the substrate 100. An insulating layer 130 substantially defines the position of each sub-pixel. For example, an opening of the insulating layer 130 can be defined as a sub-pixel unit PX. Specifically, the bottom of the opening of the insulating layer 130 can define the area of the sub-pixel unit PX, hut the present disclosure is not limited thereto. A plurality of light-emitting elements 410 are disposed on a light-shielding element 400. The light-shielding element 400 may partially overlap an alignment electrode 300A and an alignment electrode 300B. The alignment electrode 300A and the alignment electrode 300B can align the light-emitting elements 410 so that the light-emitting elements 410 are arranged in a specific direction.

It should be understood that although one sub-pixel unit PX has three light-emitting elements 410 in the illustrated embodiment, the present disclosure is not limited thereto. According to different embodiments, the sub-pixel unit PX may have other suitable number of light-emitting elements 410, for example, more than 3, more than 5, or more than 10 light-emitting elements 410, but it is not limited thereto.

Referring to FIG. 2, in some embodiments, the display device 10 includes the substrate 100 and a driving layer 200. The substrate 100 has a surface 100S, and the driving layer 200 is disposed on the surface 100S. Furthermore, the substrate 100 can be used as a driving substrate of the display device 10.

In some embodiments, the substrate 100 may include a flexible substrate, a rigid substrate, or a combination thereof, but it is not limited thereto. In some embodiments, the material of the substrate 100 may include glass, quartz, sapphire, ceramic, polyimide (PI), polycarbonate (PC), polyethylene terephthalate (PET), polypropylene (PP), other suitable materials or a combination thereof, but it is not limited thereto. Furthermore, in some embodiments, the substrate 100 may include a metal-glass fiber composite plate, or a metal-ceramic composite plate, but it is not limited thereto. In addition, the light transmittance of the substrate 100 is not limited. That is, the substrate 100 may be a transparent substrate, a semi-transparent substrate or a non-transparent substrate.

As shown in FIG. 2, in some embodiments, the driving layer 200 includes a thin-film transistor 200T, and the thin-film transistor 200T is disposed on the surface 100S and electrically connected to the light-emitting element 410. Specifically, in some embodiments, the driving layer 200 may include a buffer layer 102 disposed on the substrate 100, the thin-film transistor 200T disposed on the buffer layer 102, and conductive elements electrically connected to the thin-film transistor 200T (for example, a conductive element 206a, a conductive element 206b, etc.), signal lines (not illustrated), an insulating layer 106, an insulating layer 108, and an insulating layer 110 and so on. In some embodiments, the signal line may include, for example, a current signal line, a voltage signal line, a high-frequency signal line, and a low-frequency signal line, and the signal line that transmits device operating voltage (VDD), common ground voltage (VSS), or driving voltage, but the present disclosure is not limited thereto.

In some embodiments, the thin-film transistor 200I may include a switching transistor, a driving transistor, a reset transistor, or other thin-film transistors. In some embodiments, the driving layer 200 may include one switching transistor and one driving transistor that are electrically connected to each other, but it is not limited thereto. In addition, although the thin-film transistor 200T in the drawing is a top gate thin-film transistor, the thin-film transistor 200T may be a bottom gate thin-film transistor or a double gate (dual gate) thin-film transistor, or a combination thereof in accordance with some other embodiments. In accordance with the embodiments of the present disclosure, the number of thin-film transistors 200T is not limited to that illustrated in the drawing. In accordance with different embodiments, the display device 10 may have other suitable numbers of thin-film transistors 200T.

As shown in FIG. 2, ire some embodiments, the thin-film transistor 200T may include at least one semiconductor layer 202, a gate electrode layer 204, a conductive element 206a, and a conductive element 206b. In some embodiments, the driving layer 200 may further include a gate dielectric layer 104, the gate dielectric layer 104 and the gate electrode layer 204 may be disposed on the semiconductor layer 202, and the gate dielectric layer 104 may be disposed between the semiconductor layer 202 and the gate electrode layer 204. In some embodiments, the semiconductor layer 202 may include semiconductor portions 202p with appropriate dopants and a channel region 202c formed between the two semiconductor portions 202p. The gate electrode layer 204 may overlap the semiconductor layer 202 in a normal direction of the substrate 100 (for example, the Z direction in the drawing), and the area where the semiconductor layer 202 overlaps the gate electrode layer 204 may serve as the channel region 202c. The conductive element 206a and the conductive element 206b may be respectively electrically connected to the semiconductor portions 202p located on both sides of the semiconductor layer 202, and the semiconductor portions 202p may serve as a source contact or a drain contact. Furthermore, the conductive element 206a and the conductive element 206b may penetrate the gate dielectric layer 104, the insulating layer 106, and the insulating layer 108 to be electrically connected to the source contact and the drain contact, respectively. The conductive element 206a and the conductive element 206b may be further electrically connected to a data line and a scan line, respectively. In some embodiments, the conductive element 206a of the thin-film transistor 200T may be further electrically connected to a capacitor element, but it is not limited thereto.

In some embodiments, the material of the semiconductor layer 202 may include amorphous silicon, polysilicon, such as low-temp polysilicon (LTPS), metal oxide, other suitable materials, or a combination thereof, but it is not limited thereto. The metal oxide may include, for example, indium gallium zinc oxide (IGZO), indium zinc oxide (IZO), indium gallium zinc tin oxide (IGZTO), other suitable materials, or a combination thereof, but it is not limited thereto. In some embodiments, different thin-film transistors may have different semiconductor materials as described above.

In some embodiments, the material of the gate dielectric layer 104 may include silicon oxide, silicon nitride, silicon oxynitride, high-k dielectric materials, other suitable dielectric materials, or a combination thereof, but it is not limited thereto. The aforementioned high-k dielectric materials may include metal oxides, metal nitrides, metal silicides, transition metal oxides, transition metal nitrides, transition metal silicides, metal oxynitrides, metal aluminates, zirconium silicates, zirconium aluminates, other suitable materials, or a combination thereof, but it is not limited thereto.

In some embodiments, the material of the gate electrode layer 204 may include amorphous silicon, polysilicon, metal, metal nitride, metal oxide, or a combination thereof, but it is not limited thereto. The aforementioned metal may include molybdenum (Mo), tungsten (W), titanium (Ti), tantalum (Ta), platinum (Pt), hafnium (Hf), alloys of the foregoing metals, other suitable materials, or a combination thereof, but it is not limited thereto. The aforementioned metal nitride may include molybdenum nitride, tungsten nitride, titanium nitride, tantalum nitride, other suitable materials, or a combination thereof, but it is not limited thereto.

Furthermore, in some embodiments, the material of the conductive element 206a and the conductive element 206b may include metal materials. For example, the metal material may include copper (Cu), aluminum (Al), molybdenum (Mo), tungsten (W), gold (Au)), silver (Ag), tin (Sn), chromium (Cr), nickel (Ni), platinum (Pt), titanium (Ti), iridium (Ir), rhodium (Rh), alloys of the foregoing metals, other suitable conductive materials, or a combination thereof, but it is not limited thereto. In some embodiments, the gale electrode layer 204, the conductive element 206a and/or the conductive element 206b may have a single-layer structure or a multi-layer structure, but the present disclosure is not limited thereto.

In addition, the buffer layer 102 may reduce the strain difference between the semiconductor layer 202 and the substrate 100. In some embodiments, the material of the buffer layer 102 may include an organic material, an inorganic material, or a combination thereof. For example, the organic material may include polyethylene terephthalate (PET), polyethylene (PE), polyethersulfone (PES), polycarbonate (PC), polymethylmethacrylate (PMMA), isoprene, phenol-formaldehyde resin, benzocyclobutene (BCB), perfluorocyclobutane (PECB), other organic suitable buffer materials or a combination thereof, but it is not limited thereto. For example, the inorganic material may include silicon nitride, silicon oxide, silicon oxynitride, other suitable inorganic buffer materials, or a combination thereof, but it is not limited thereto.

Furthermore, in some embodiments, the materials of the insulating layer 106, the insulating layer 108, and the insulating layer 110 may include an inorganic insulating material or an organic insulating material. The inorganic insulating material may include, for example, silicon nitride, silicon oxide, silicon oxynitride, aluminum oxide, other suitable materials, or a combination thereof, but it is not limited thereto. The organic insulating material may include, for example, perfluoroalkoxy alkane (PFA), polytetrafluoroethylene (PTFE), fluorinated ethylene propylene (FEP), polyethylene, other suitable materials, or a combination thereof, but it is not limited thereto. In some embodiments, the buffer layer 102, the insulating layer 106, the insulating layer 108, and/or the insulating layer 110 may have a single-layer structure or a multi-layer structure, but the present disclosure is not limited thereto.

As shown in FIG. 2, in some embodiments, the driving layer 200 may further include a semiconductor layer 202', a gate electrode layer 204', acid a conductive element 206c. The semiconductor layer 202' and the semiconductor layer 202 of the thin-film transistor 200T may be formed in the same manufacturing process. The semiconductor layer 202' may not have a channel region and may serve as an elevated structure. In some other embodiments, the semiconductor 202' may serve as a capacitor structure. The materials of the semiconductor layer 202' and the gate electrode layer 204' are similar to those of the aforementioned semiconductor layer 202 and the gate electrode layer 204 and thus will not be repeated here.

Furthermore, the gate electrode layer 204' may be electrically connected to the conductive element 206c, and the conductive element 206c may be electrically connected to a common electrode (not illustrated), but it is not limited thereto. Specifically, the conductive element 206c may also penetrate the insulating layer 106 and the insulating layer 108 to be electrically connected to the gate electrode layer 204'. In some embodiments, the conductive element 206c may be electrically connected to the common electrode through a via hole. The material of the conductive element 206c is similar to those of the aforementioned conductive element 206a and the conductive element 206b, and thus will not be repeated here.

Still referring to FIG. 2, in some embodiments, the display device 10 includes a light-emitting element 410, a light-shielding element 400, and a pair of alignment electrodes (an alignment electrode 300A and an alignment electrode 300B) disposed on the driving layer 200. The light-shielding element 400 is disposed between the light-emitting element 410 and the thin-film transistor 200T of the driving layer 200. In other words, in the normal direction of the substrate 100 (for example, the Z direction in the drawing), the light-shielding element 400 at least partially overlaps the thin-film transistor 200T and the light-emitting element 410. In addition, the light-shielding element 400 can block a light L emitted from the light-emitting element 410 from irradiating the thin-film transistor 202T, so that the probability of abnormality occurring in the thin-film transistor 202T can be reduced. Moreover, the alignment electrode 300A and the alignment electrode 300B can generate an electric field with a particular direction so that the light-emitting element 410 can be arranged along a specific direction. That is, the alignment electrode 300A and the alignment electrode 300B can be used to align the light-emitting element 410.

Specifically, in some embodiments, the light-shielding element 400 is disposed on the insulating layer 110, and the insulating layer 112 is disposed on the light-shielding element 400. In some embodiments, the alignment electrode 300A and the alignment electrode 300B are disposed on the insulating layer 112, and there is a gap G between the alignment electrode 300A and the alignment electrode 300B. In some embodiments, the light-shielding element 400 is disposed below the alignment electrode 300A and the alignment electrode 300B. In some embodiments, in the normal direction of the substrate 100 (for example, the Z direction in the drawing), the light-shielding element 400 at least partially overlaps the alignment electrode 300A and the alignment electrode 300B. In some embodiments, in the normal direction of the substrate 100 (for example, the Z direction in the drawing), the light-shielding element 400 at least partially overlaps the gap G between the alignment electrode 300A and the alignment electrode 300B. In addition, as shown in FIG. 2, in some embodiments, the alignment electrode 300A is electrically connected to the gate electrode layer 204' through a via hole V1. The via hole V1 may penetrate through insulating layer 106, insulating layer 108, insulating layer 110 and insulating layer 112.

In the embodiment shown in FIG. 2, the material of the light-shielding element 400 may include a reflective material, but it is not limited thereto. In this embodiment, the light-shielding element 400 may be a conductor, for example, a metal material. In some embodiments, the metal material may include copper (Cu), aluminum (Al), molybdenum (Mo), tungsten (W), gold (Au), silver (Ag), tin (Sn), chromium (Cr), nickel (Ni), platinum (Pt), titanium (Ti), iridium (Ir), rhodium (Rh), alloys of the foregoing metals, other suitable conductive materials, or a combination thereof, but it is not limited thereto. It should be noted that, since the material of the light-shielding element 400 has reflective properties, it can reflect the light L emitting toward the light-shielding element 400. Therefore, the light extraction efficiency of the display device 10 can be improved, for example, the light extraction efficiency can be increased by about 50%.

Furthermore, in some embodiments, the thickness of the light-shielding element 400 may be in a range from 100 Angstroms (Å) to 100000 Å, or in a range from 1000 Å to 50000 Å, for example, 2000 Å, 20000 Å, or 50000 Å. In accordance with the embodiments of the present disclosure, the thickness of the light-shielding element 400 refers to the maximum thickness of the light-shielding element 400 in the normal direction of the substrate 100 (for example, the Z direction in the drawing).

In accordance with the embodiments of the present disclosure, an optical microscope (OM), a scanning electron microscope (SEM), a film thickness profiler (α-step), an ellipsometer or other suitable methods may be used to measure the distance or pitch between elements, or the thickness or width of the element. Specifically, in some embodiments, a scanning electron microscope may be used to obtain a cross-sectional image including the elements to be measured, and the distance or pitch between elements, or the thickness or width of the element in the image can be measured.

Furthermore, the material of the insulating layer 112 is similar to those of the aforementioned insulating layer 106, the insulating layer 108, and the insulating layer 110, and thus will not be repeated here.

In addition, in some embodiments, the light-shielding element 400 may have a non-flat upper surface (for example, the surface close to the light-emitting element 410) or an inclined upper surface, thereby improving the uniformity of the angle of light output from the display device 10. Furthermore, in some embodiments, the light-shielding element 400 may cover most of the insulating layer 110. For example, in the normal direction of the substrate 100 (for example, the Z direction in the drawing), the light-shielding element 400 and the alignment electrode 300A may have an overlapping area greater than 50%, and the light-shielding element 400 and the alignment electrode 300B may have an overlapping area greater than 50%. In this way, the large-area light-shielding element 400 formed of metal can effectively improve the heat dissipation efficiency of the display device 10.

Furthermore, in this embodiment, the alignment electrode 300A and the alignment electrode 300B are closer to the light-emitting element 410 than the light-shielding element 400. In detail, in the normal direction of the substrate 100, a minimum distance between the alignment electrodes 300A and 300B and the light-emitting element 410 is smaller than a minimum distance between the light-shielding element 400 and the light-emitting element 410.

It should be noted that since the light-shielding element 400 is a conductor, the light-shielding element 400 is disposed farther away from the light-emitting element 410 to reduce the influence of the light-shielding element 400 on the electric field of the alignment electrode 300A and the alignment electrode 300B during alignment.

Furthermore, in some embodiments, the materials of the alignment electrode 300A and the alignment electrode 300B may include a metal conductive material, a transparent conductive material, other suitable materials, or a combination thereof, but they are not limited thereto. The metal conductive material may include, for example, copper (Cu), silver (Ag), gold (Au), tin (Sn), aluminum (Al), molybdenum (Mo), tungsten (W), chromium (Cr), nickel (Ni) platinum (Pt), titanium (Ti), alloys of the foregoing metals, other suitable materials, or a combination thereof, but it is not limited thereto. The transparent conductive material may include transparent conductive oxide (TCO), for example, indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), other suitable transparent conductive materials, or a combination thereof, but it is not limited thereto.

Still referring to FIG. 2, in some embodiments, the insulating layer 114 is disposed on the insulating layer 112 and covers the alignment electrode 300A and the alignment electrode 300B, and the insulating layer 116 can be used as a planarization layer and is disposed on the insulating layer 114. In addition, in some embodiments, the display device 10 includes a conductive element 206d, a conductive element 206e, and a conductive element 206f. The conductive element 206d, the conductive element 206e, and the conductive element 206f may penetrate the insulating layers and may be electrically connected to the common electrode (not illustrated), the alignment electrode 300B and the thin-film transistor 200T, respectively.

Furthermore, the materials of the insulating layer 114 and the insulating layer 116 are similar to those of the aforementioned insulating layer 106, the insulating layer 108, and the insulating layer 110. The materials of the conductive element 206d, the conductive element 206e, and the conductive element 206f are similar to those of the aforementioned conductive element 206a and the conductive element 206b, and thus will not be repeated here.

In addition, as shown in FIG. 2, in some embodiments, the light-emitting element 410 and the insulating layer 130 are disposed on the insulating layer 116. In addition, the light-emitting element 410 is disposed between portions of the insulating layer 130, and in a trench or an opening defined by the insulating layer 130 and emits the light L.

In some embodiments, the light-emitting element 410 may include a light-emitting diode, for example, a micro-LED, a mini light-emitting diode (mini-LED), an organic light-emitting diode (OLED), or a quantum dot light-emitting diode (QLED, QDLED), but it is not limited thereto. In some embodiments, the light-emitting element 410 may be a bar-shaped light-emitting diode (bar LED). As shown in FIG. 1, in some embodiments, one sub-pixel unit PX may have a plurality of light-emitting elements 410, and the plurality of light-emitting elements 410 may have a single color or multiple colors, for example, red, green, blue, white, or other suitable colors, but the present disclosure is not limited thereto.

Specifically, in some embodiments, the light-emitting element 410 has a P-end 410P, an N-end 410N, and a quantum well region 410Q, and the quantum well region 410Q is located between the P-end 410P and the N-end 410N. The P-end 410P and the N-end 410N refer to an end portion of the P-type semiconductor layer and an end portion of the N-type semiconductor layer, respectively. In some embodiments, the material of the N-type semiconductor layer may include gallium nitride (n-GaN) or aluminum indium phosphide (n-AlInP) doped with tetravalent atoms, and the P-type semiconductor material may include gallium nitride (p-GaN) or aluminum indium phosphide (p-AlInP) doped with divalent atoms, but they are not limited thereto. In some embodiments, the quantum well recon 410Q may include a single quantum well (SQW), a multiple quantum well (MQW), other suitable structures, or a combination thereof. Moreover, in some embodiments, the light-emitting element 410 may be mixed in a solution, and the solution may include any one or more of acetone, water, alcohol, and toluene, but it is not limited thereto.

It should be noted that, in some embodiments, the display device 10 can provide a pair of DC voltage or AC voltage, so that there is a potential difference between the alignment electrode 300A and the alignment electrode 300B, and an electric field can be generated between the alignment electrode 300A and the alignment electrode 300B. The P-end 410P and the N-end 410N of the light-emitting element 410 placed in the solution will be attracted by the electric field and arranged along a direction parallel to the electric field. In other words, the alignment electrode 300A and the alignment electrode 300B can generate an electric field in a specific direction so that the light-emitting element 410 is arranged along a specific direction. In addition, referring to FIG. 1, the positions of the P-end 410P and the N-end 410N in different sub-pixel units PX may be the same or different. In some embodiments, the positions of the P-end 410P and the N-end 410N in different sub-pixel units PX may be opposite.

In detail, refer to FIG. 3A and FIG. 3B. FIG. 3A and FIG. 3B are cross-sectional diagrams of the light-emitting element 410 of the display device 10 in accordance with some embodiments of the present disclosure. In some embodiments, the electric field generated by the alignment electrode 300A and the alignment electrode 300B causes the light-emitting element 410 to be arranged in a specific direction, so that a virtual line VL connecting the P-end 410P and the N-end 410N is parallel to the surface 100S of the substrate 100. For example, the term "parallel" means that the angle between the virtual line VL and the surface 100S of the substrate 100 may be between 0 degrees and 10 degrees.

In some embodiments, the virtual line VL connecting the P-end 410P and the N-end 410N refers to a line connecting a terminal center CP of the P-end 410P and a terminal center CP of the N-end 410N. Furthermore, in the embodiment where the end portion of the light-emitting element 410 substantially has a right angle (for example, as shown in FIG. 3A), the virtual line VL is a line connecting the center points of the end surfaces of the P-end 410P and the N-end 410N. In the embodiment where the end portion of the light-emitting element 410 has an arc angle RC (for example, as shown in FIG. 3B), the virtual line VL is a line connecting the most protruding points of the end surfaces of the P-end 410P and the N-end 410N.

Referring to FIG. 2 again, as described above, the light-emitting element 410 may be disposed between portions of the insulating layer 130 and located in the trenches or openings defined by the insulating layers 130. In some embodiments, the insulating layer 130 may serve as a pixel define layer (PDL) of the display device 10. In some embodiments, the height (not labeled) of the insulating layer 130 may be greater than the height (not labeled) of the light-emitting element 410. In addition, the height of the insulating layer 130 refers to the maximum height of the insulating layer 130 in the normal direction of the substrate 100 (for example, the Z in the drawing), and the height of the light-emitting element 410 refers to the maximum height of the light-emitting element 410 in the normal direction of the substrate 100. In some embodiments, the insulating layer 130 can improve the overall color uniformity of the light-emitting element 410.

In some embodiments, the material of the insulating layer 130 is similar to those of the aforementioned insulating layer 106, the insulating layer 108, and the insulating layer 110. In some embodiments, the insulating layer 130 may be, for example, a black matrix, but it is not limited thereto. In some embodiments, the material of the insulating layer 130 may include black photoresist material, black printing ink, black resin, other suitable materials, or a combination thereof, but it is not limited thereto. In this embodiment, the insulating layer 130 can reduce the risk of light leakage. In some embodiments, the surface of the insulating layer 130 may be optionally covered by a reflective structure formed of a metal material or a stack of multiple insulating layers (for example, the insulating layers containing inorganic materials) to improve the light extraction efficiency of the display device 10, but the present disclosure is not limited thereto.

Referring to FIG. 2, in some embodiments, the display device 10 further includes an insulating layer 132, a conductive layer 220, and an insulating layer 118. The insulating layer 132 is disposed on the light-emitting element 410. The conductive layer 220 is disposed on the light-emitting element 410 and the insulating layer 132. The insulating layer 118 is disposed on the conductive layer 220.

In some embodiments, in the normal direction of the substrate 100 (for example, the Z direction in the drawing), the insulating layer 132 overlaps the quantum well region 410Q, a portion of the P-end 410P and a portion of the N-end 410N. The material of the insulating layer 132 is similar to those of the aforementioned insulating layer 106, the insulating layer 108, and the insulating layer 110, and thus will not be repeated here. It should be noted that the insulating layer 132 may be transparent or semi-transparent.

Furthermore, in some embodiments, the conductive layer 220 covers the light-emitting element 410, the insulating layer 132, the insulating layer 130, the conductive element 206d, the conductive element 206e, and the conductive element 206f. In addition, the conductive layer 220 may be electrically connected to the light-emitting element 410, the conductive element 206d, the conductive element 206e, and the conductive element 206f. Specifically, the conductive layer 220 may cover the upper surface of the insulating layer 132, and may cover at least portions of the P-end 410P and N-end 410N of the light-emitting element 410. In some embodiments, the material of the conductive layer 220 may include transparent conductive oxide (TCO). For example, the transparent conductive oxide may include indium tin oxide (ITO), antimony zinc oxide (AZO), tin oxide (SnO), zinc oxide (ZnO), oxide indium zinc (IZO), indium gallium zinc oxide (IGZO), indium tin zinc oxide (ITZO), antimony tin oxide (ATO), other suitable transparent conductive materials, or a combination thereof, but it is not limited thereto.

In some embodiments, the insulating layer 118 can serve as a planarization layer, and is disposed on the conductive layer 220, covering the light-emitting element 410, the insulating layer 132, the insulating layer 130, the conductive element 206d, the conductive element 206e, and the conductive element 206f. The material of the insulating layer 118 is similar to those of the aforementioned insulating layer 106, the insulating layer 108, and the insulating layer 110, and thus will not be repeated here. It should be noted that the insulating layer 118 may be light-transmitting or semi-light-transmitting.

Figure 4A:
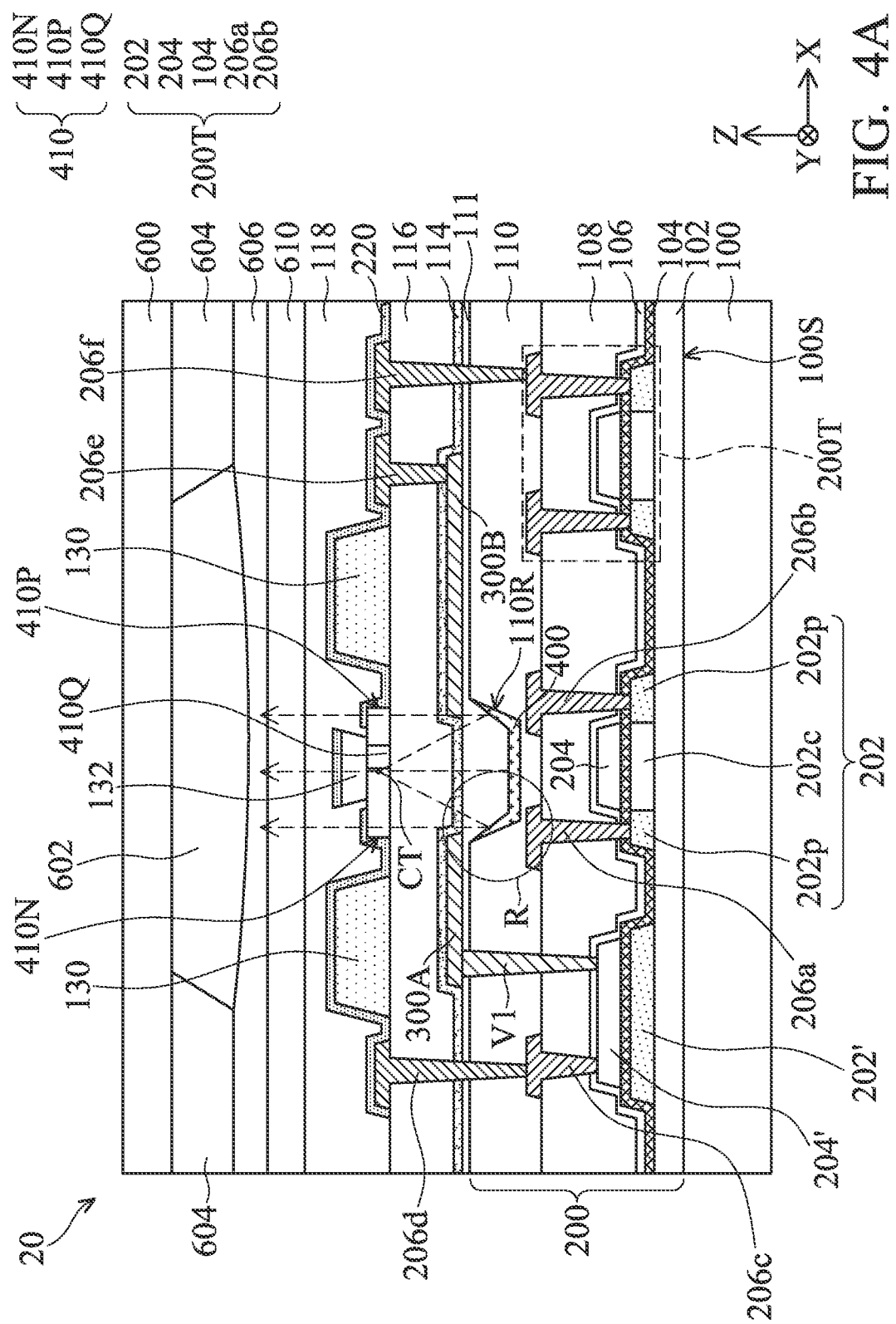
FIG. 4A is a cross-sectional diagram of a display device in accordance with some embodiments of the present disclosure.
Figure 4B:
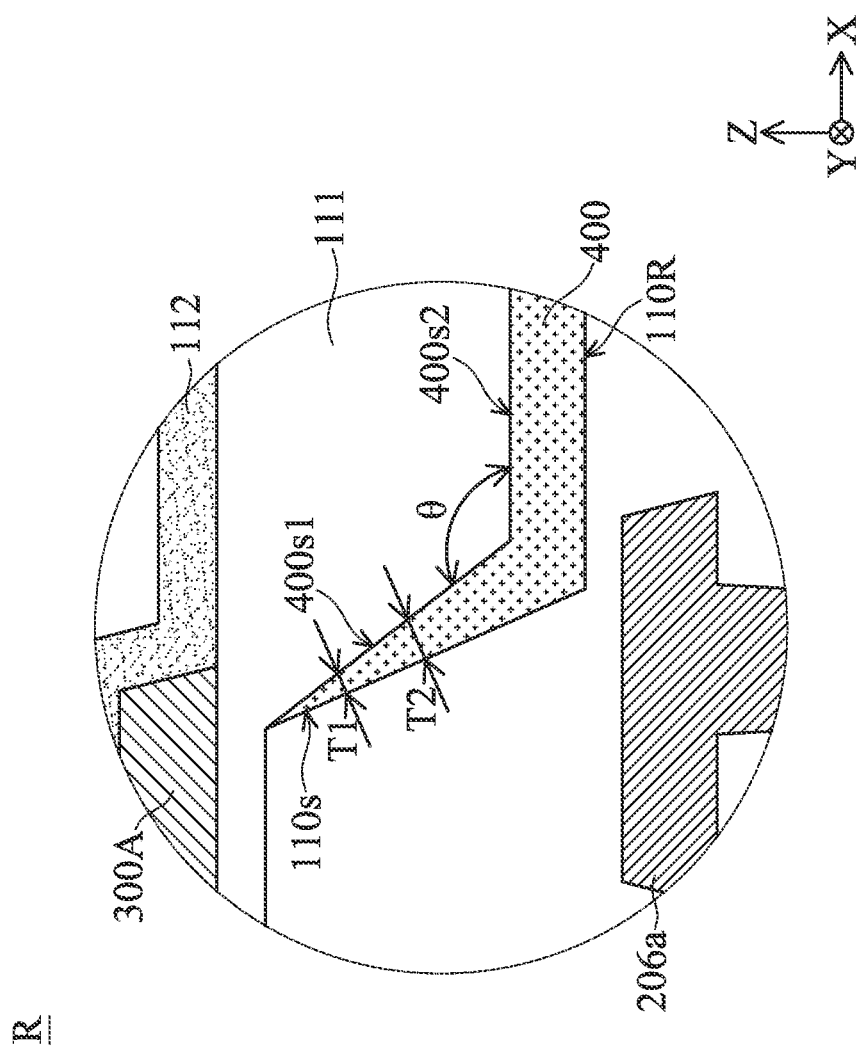
FIG. 4B is an enlarged diagram of region R of FIG. 4A in accordance with some embodiments of the present disclosure.

Next, refer to FIG. 4A and FIG. 4B. FIG. 4A is a cross-sectional diagram of a display device 20 in accordance with some other embodiments of the present disclosure. FIG. 4B is an enlarged diagram of region R of FIG. 4A. It should be understood that the same or similar components (or elements) in the following paragraph will be denoted by the same or similar reference numbers, and their materials, manufacturing methods and functions are the same or similar to those described above, and thus they will not be repeated in the following context.

The display device 20 shown in FIG. 4A is substantially the same as the display device 10 shown in FIG. 2. The difference between them includes that, the light-shielding element 400 of the display device 20 is disposed in a recess 110R of the insulating layer 110. In addition, the display device 20 further includes an insulating layer 111, and the insulating layer 111 is disposed between the insulating layer 110 and the insulating layer 114 and filled in the recess 110R.

Referring to FIG. 4B, in some embodiments, the recess 110R has an inclined side surface 110s, and the thickness of the light-shielding element 400 disposed in the recess 110R may be variable. In some embodiments, the light-shielding element 400 on the side surface 110s has a thickness T1 at a position closer to the light-emitting element 410, the light-shielding element 400 on the side surface 110s has a thickness T2 at a position farther from the light-emitting element 410, and the thickness T1 is smaller than the thickness T2. In accordance with the embodiments of the present disclosure, the thickness T1 and the thickness T2 refer to the thickness of the light-shielding element 400 in a direction perpendicular to the side surface 110s.

In addition, there may be an included angle θ between a side surface 400s1 and a bottom surface 400s2 of the light-shielding element 400 disposed in the recess 110R. In some embodiments, the included angle θ may be to a range from 90 degrees to 170 degrees, or in a range from 120 degrees to 150 degrees, for example, 100 degrees, 110 degrees, 120 degrees, 130 degrees, 140 degrees, or 150 degrees.

It should be noted that in this embodiment, the light-shielding element 400 also includes a reflective material, such as a conductor. The light-shielding element 400 disposed in the recess 110R can reflect and focus the light irradiating the light-shielding element 400, or can assist in optical path correction (for example, correcting the light to become parallel). In some embodiments, a focal point CT of the light reflected by the light-shielding element 400 overlaps the light-emitting element 410, which can further improve the collimation of the light output from the display device 20 or the light extraction efficiency of the display device 20.

Moreover, as shown in FIG. 4A, in some embodiments, the display device 20 optionally includes a substrate 600, a wavelength conversion layer 602, blocking elements 604, an insulating layer 606, and an adhesive layer 610. In some embodiments, the adhesive layer 610, the insulating layer 606, the wavelength conversion layer 602, and the substrate 600 are sequentially disposed on the insulating layer 118, and the wavelength conversion layer 602 is disposed between the blocking elements 604.

In some embodiments, the adhesive layer 610 may have an adhesive function, may fix the insulating layer 606 with the insulating layer 118, and may have a moisture-proof function or an insulating function, but it is not limited thereto. In some embodiments, the material of the adhesive layer 610 may include a light-cured adhesive material, a heat-cured adhesive material, a light-heat-cured adhesive material, other suitable materials, or a combination thereof, but it is not limited thereto. For example, in some embodiments, the material of the adhesive layer 610 may include an optical clear adhesive (OCA), an optical clear resin (OCR), other suitable materials, or a combination thereof. Furthermore, the adhesive layer 610 may be transparent or semi-transparent.

In some embodiments, the insulating layer 606 is disposed between the adhesion layer 610 and the blocking element 604, and between the adhesion layer 610 and the wavelength conversion layer 602. Furthermore, the material of the insulating layer 606 is similar to those of the aforementioned insulating layer 106, the insulating layer 108, and the insulating layer 110, and thus will not be repeated here. It should be noted that the insulating layer 606 may be transparent or semi-transparent.

In addition, the wavelength conversion layer 602 can convert the light emitted from the light-emitting element 410 into light having a specific color or wavelength. In some embodiments, in the normal direction of the substrate 100 (for example, the Z direction in the drawing), the wavelength conversion layer 602 at least partially overlaps the light-emitting element 410. In some embodiments, the wavelength conversion layer 602 at least partially overlaps the insulating layer 130 in the normal direction of the substrate 100. In some embodiments, the wavelength conversion layer 602 may include polymer matrix or glass matrix, and phosphors, quantum dot materials, or fluorescent materials dispersed in the matrix, but it is not limited thereto. In some embodiments, the quantum dot material may have a core-shell structure. The core material may include CdSe, CdTe, CdS, ZnS, ZnSe, ZnO, ZnTe, InAs, InP, GaP, other suitable materials, or a combination thereof, but it is not limited thereto. The shell material may include ZnS, ZnSe, GaN, GaP, other suitable materials, or a combination thereof, but it is not limited thereto.

In addition, the blocking element 604 may be adjacent to the wavelength conversion layer 602 and disposed between the insulating layer 606 and the substrate 600. In some embodiments, in the normal direction of the substrate 100 (for example, the Z direction in the drawing), the blocking element 604 at least partially overlaps the conductive element 206d, the conductive element 206e, and the conductive element 206f. In some embodiments, the blocking element 604 may be, for example, a black matrix. In some embodiments, the material of the blocking element 604 may include black photoresist material, black printing ink, black resin, photosensitive material, other suitable materials, or a combination thereof, but it is not limited thereto.

In some embodiments, the substrate 600 may serve as a cover substrate of the display device 20. The material of the substrate 600 may include glass, quartz, sapphire, ceramic, other suitable materials, or a combination thereof, but it is not limited thereto. Furthermore, the material of the substrate 600 may be the same as or different from that of the substrate 100.

Figure 5:
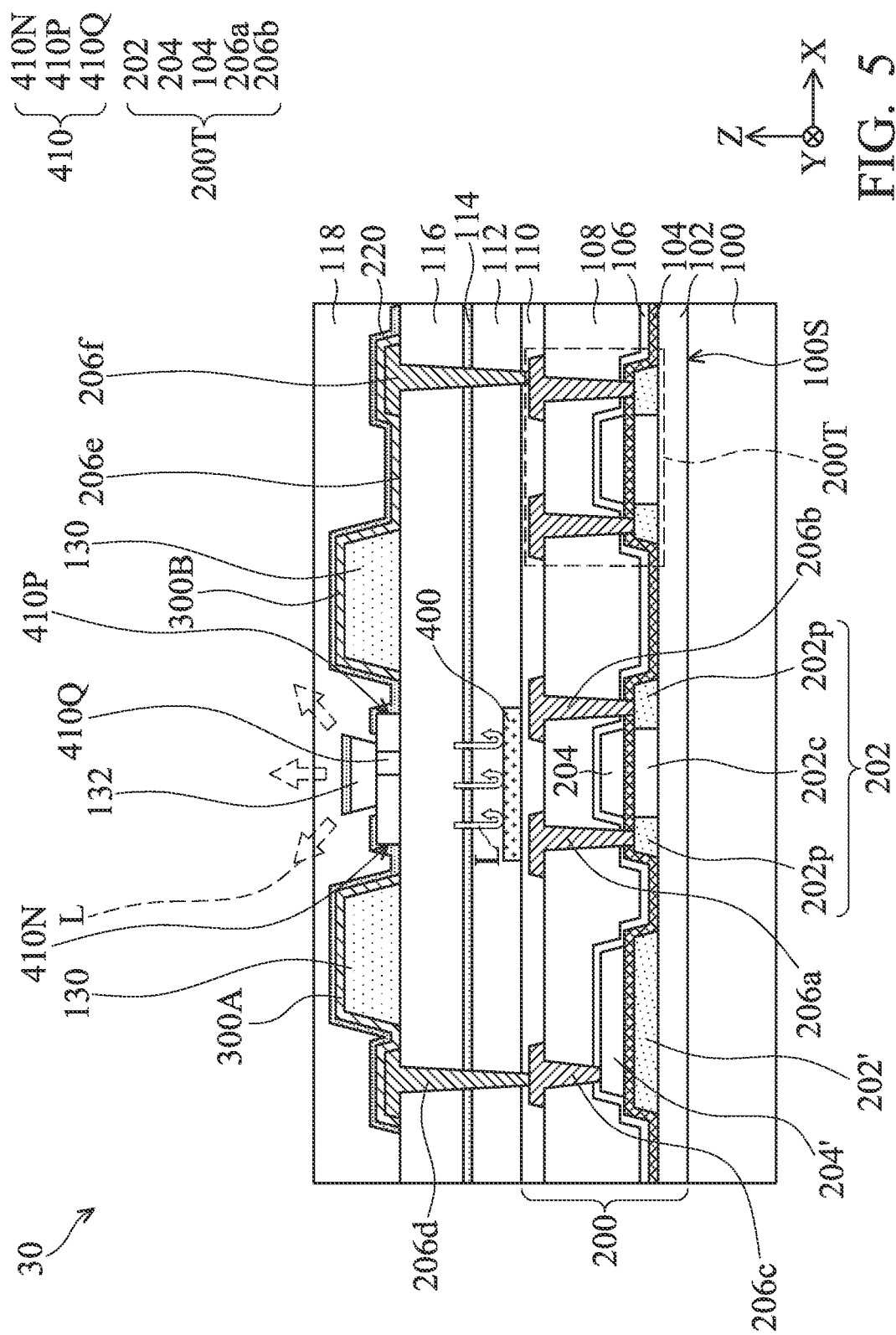
FIG. 5 is a cross-sectional diagram of a display device in accordance with some embodiments of the present disclosure.

Next, refer to FIG. 5, which is a cross-sectional diagram of a display device 30 in accordance with some other embodiments of the present disclosure. The display device 30 shown in FIG. 5 is substantially the same as the display device 10 shown in FIG. 2. The difference between them includes that, the alignment electrode 300A and the alignment electrode 300B of the display device 30 are not disposed between the insulating layer 112 and the insulating layer 114. Instead, the alignment electrode 300A and the alignment electrode 300B are disposed on the conductive element 206d, the conductive element 206f, and the insulating layer 130. Specifically, the alignment electrode 300A is disposed on the insulating layer 116 and at least partially covers the conductive element 206d and the insulating layer 130, and the alignment electrode 300B is disposed on the insulating layer 116 and at least partially covers the conductive element 206f and the insulating layer 130. Furthermore, the alignment electrode 300A is electrically connected to the conductive element 206*d* and the conductive layer 220, and the alignment electrode 300B is electrically connected to the conductive element 206*f* and the conductive layer 220.

Figure 6:
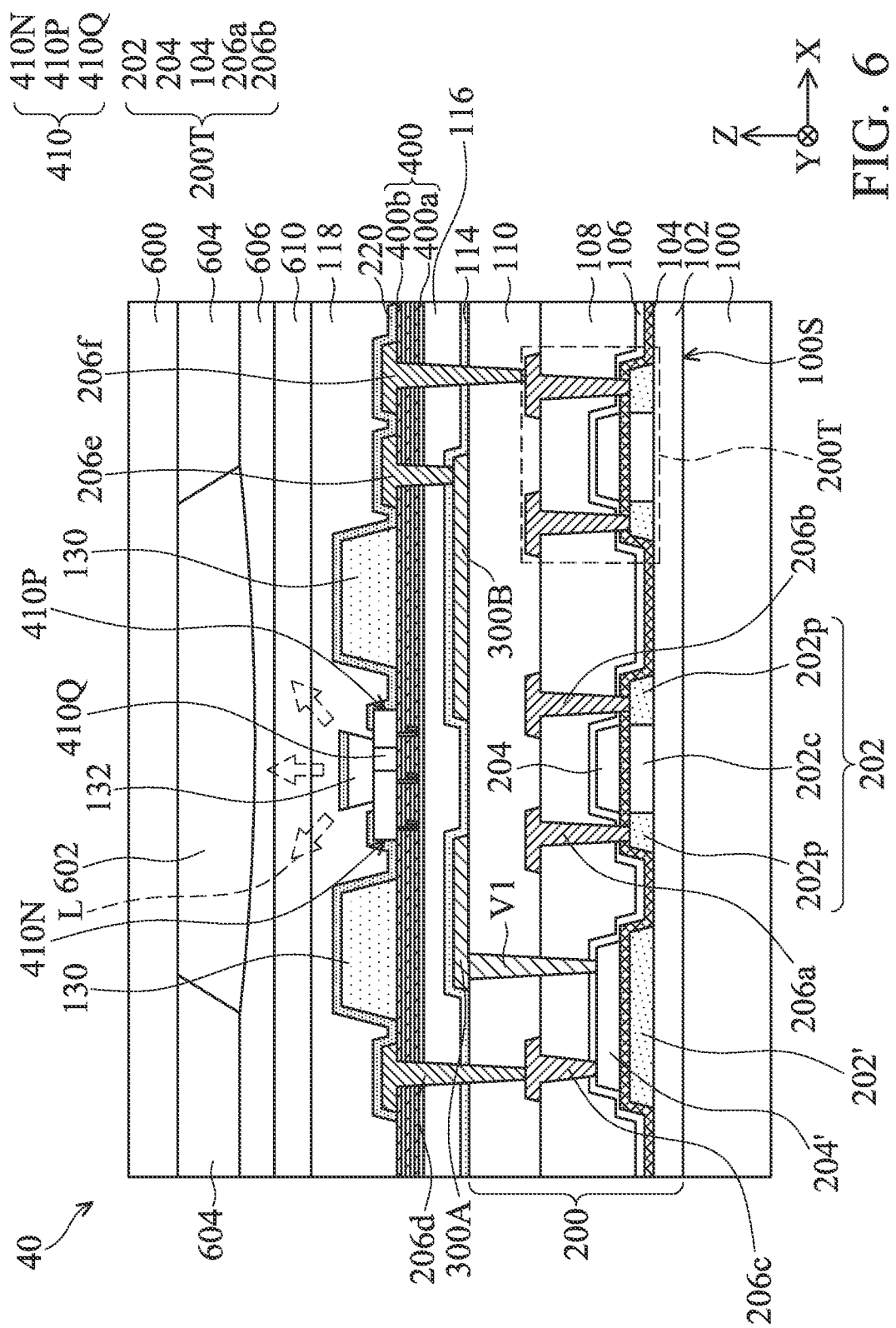
FIG. 6 is a cross-sectional diagram of a display device in accordance with some embodiments of the present disclosure.

Next, refer to FIG. 6, which is a cross-sectional diagram of a display device 40 in accordance with some other embodiments of the present disclosure. As shown in FIG. 6, in some embodiments, the light-shielding element 400 is disposed on the insulating layer 116 and located between the light-emitting element 410 and the alignment electrodes 300A and 300B. In other words, in this embodiment, the light-shielding element 400 is closer to the light-emitting element 410 than the alignment electrode 300A and the alignment electrode 300B. Specifically, in the normal direction of the substrate 100, the minimum distance between the alignment electrode 300A (or the alignment electrode 300B) and the light-emitting element 410 is greater than the minimum distance between the light-shielding element 400 and the light-emitting element 410. In addition, although the light-shielding element 400 is disposed on the insulating layer 116 in the form of a layer in the embodiment shown in FIG. 6, the light-shielding element 400 may be disposed corresponding to the light-emitting element 410 in accordance with some other embodiments. That is, in the normal direction of the substrate 100, the light-shielding element 400 and the light-emitting element 410 at least partially overlap.

Furthermore, in this embodiment, the material of the light-shielding element 400 includes an insulating material. In this embodiment, the light-shielding element 400 may be an insulator. In some embodiments, the light-shielding element 400 may have a multilayer structure, such as a distributed Bragg reflector (DBR) structure. Specifically, the light-shielding element 400 may include sub-layers 400*a* and sub-layers 400*b*. The sub-layer 400*a* and the sub-layer 400*b* may have different refractive indexes. For example, the sub-layer 400*a* and the sub-layer 400*b* may have relatively high and relatively low refractive indexes, respectively. The sub-layers 400*a* and the sub-layers 400*b* may be alternately stacked on each other. In some embodiments, the thickness of the sub-layer 400*a* having a relatively high refractive index may be smaller than the thickness of the sub-layer 400*b* having a relatively low refractive index. In some embodiments, the refractive index difference between the sub-layer 400*a* and the sub-layer 400*b* may be 0.3 or more, for example, 1 or more. In some embodiments, the stacked structure formed by the sub-layers 400*a* and the sub-layers 400*b* may include at least 5 layers, for example, 6 layers, 7 layers, 8 layers, 9 layers, or 10 layers, but it is not limited thereto. According to different embodiments, the number of sub-layers 400*a* and sub-layers 400*b* can be adjusted according to the desired range of reflectivity.

Specifically in some embodiments, the sub-layer 400*a* and the sub-layer 400*b* may include several dielectric materials with different refractive indexes. In some embodiments, the dielectric materials may include silicon oxide (SiOx), silicon nitride (SiNx), silicon oxynitride (SiON), aluminum oxide ($Al_2O_3$), titanium dioxide ($TiO_2$), titanium oxide (TiO), polytetrafluoroethylene (PTFE), other suitable materials, or a combination thereof, but they are not limited thereto.

It should be noted that in this embodiment, since the light-shielding element 400 is an insulator, even if the light-shielding element 400 is disposed closer to the light-emitting element 410, it will not affect the electric field generated by the alignment electrode 300A and the alignment electrode 300B. In addition, since the light-shielding element 400 is closer to the light-emitting element 410, it can further improve the light reflection efficiency or reduce the risk of light leakage.

Figure 7:
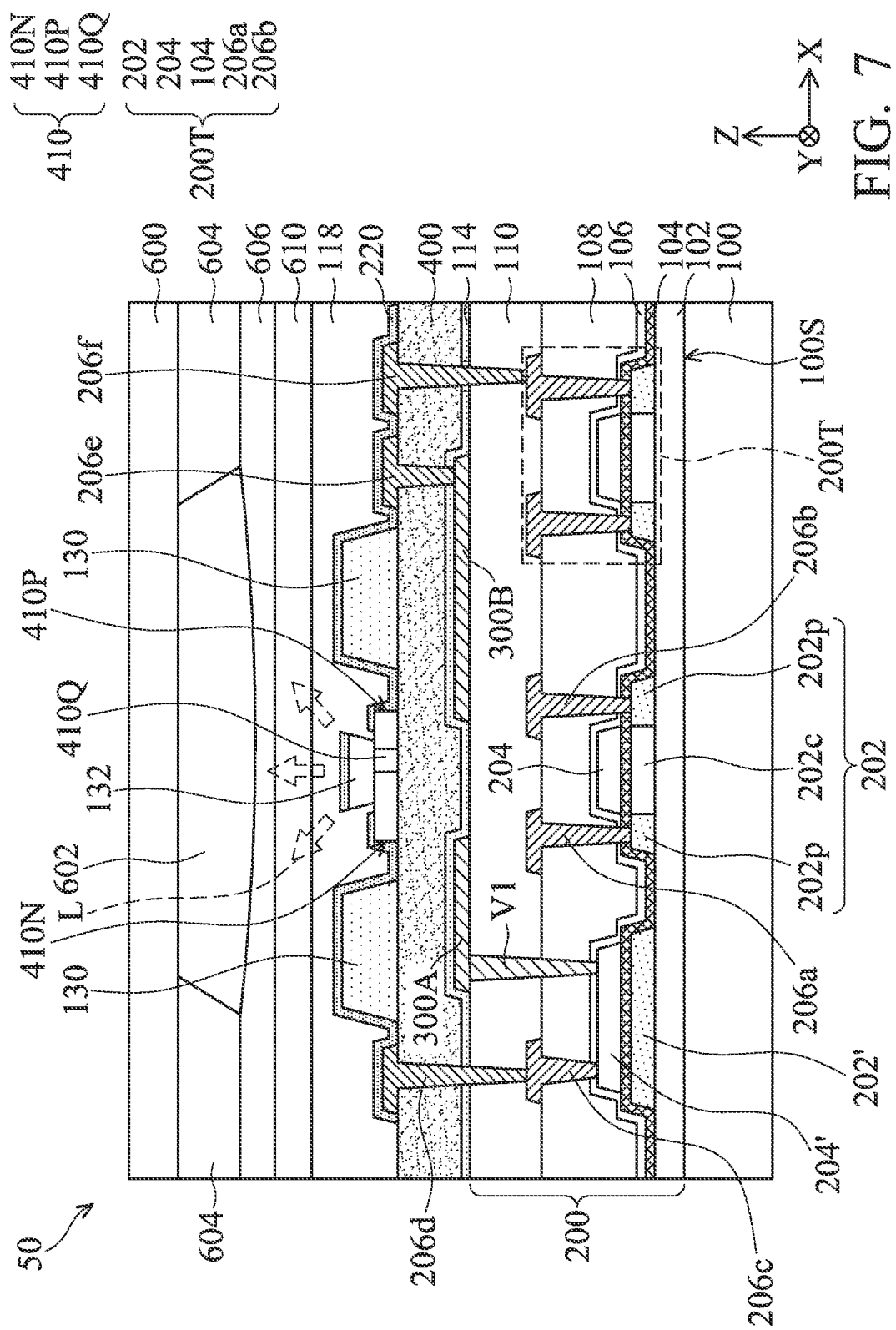
FIG. 7 is a cross-sectional diagram of a display device in accordance with some embodiments of the present disclosure.

Next, refer to FIG. 7, which is a cross-sectional diagram of a display device 50 in accordance with some other embodiments of the present disclosure. As shown in FIG. 7, in some embodiments, the light-shielding element 400 is disposed on the alignment electrode 300A and the alignment electrode 300B in the form of a layer. In this embodiment, the light-shielding element 400 can replace the insulating layer 116 as a planarization layer, and the light-shielding element 400 is disposed between the light-emitting element 410 and the alignment electrodes 300A and 300B. In other words, in this embodiment, the light-shielding element 400 is closer to the light-emitting element 410 than the alignment electrode 300A and the alignment electrode 300B. Specifically, in the normal direction of the substrate 100, the minimum distance between the alignment electrodes 300A and 300B and the light-emitting element 410 is greater than the minimum distance between the light-shielding element 400 and the light-emitting element 410 (in this embodiment, the minimum distance between the light-shielding element 400 and the light-emitting element 410 may be zero).

Furthermore, in this embodiment, the material of the light-shielding element 400 may include a light-absorbing material, but it is not limited thereto. In this embodiment, the light-shielding element 400 may be an insulator. In this embodiment, the light-shielding element 400 may be, for example, a black matrix. In some embodiments, the material of the light-shielding element 400 may include black photoresist material, black printing ink, black resin, other suitable materials, or a combination thereof, but it is not limited thereto.

Moreover, in this embodiment, the thickness of the light-shielding element 400 may be in a range from 0.01 micrometer (μm) to 10 μm, or in a range from 0.1 μm to 5 μm, for example, 0.2 μm or 2 μm, but it is not limited thereto.

It should be noted that in this embodiment, since the light-shielding element 400 is an insulator and a light-absorbing material, even if the light-shielding element 400 is disposed closer to the light-emitting element 410, it will not affect the electric field generated by the alignment electrode 300A and the alignment electrode 300B. In addition, since the light-shielding element 400 has light absorption characteristics, it can further reduce the risk of light leakage when being disposed closer to the light-emitting element 410.

Figure 8:
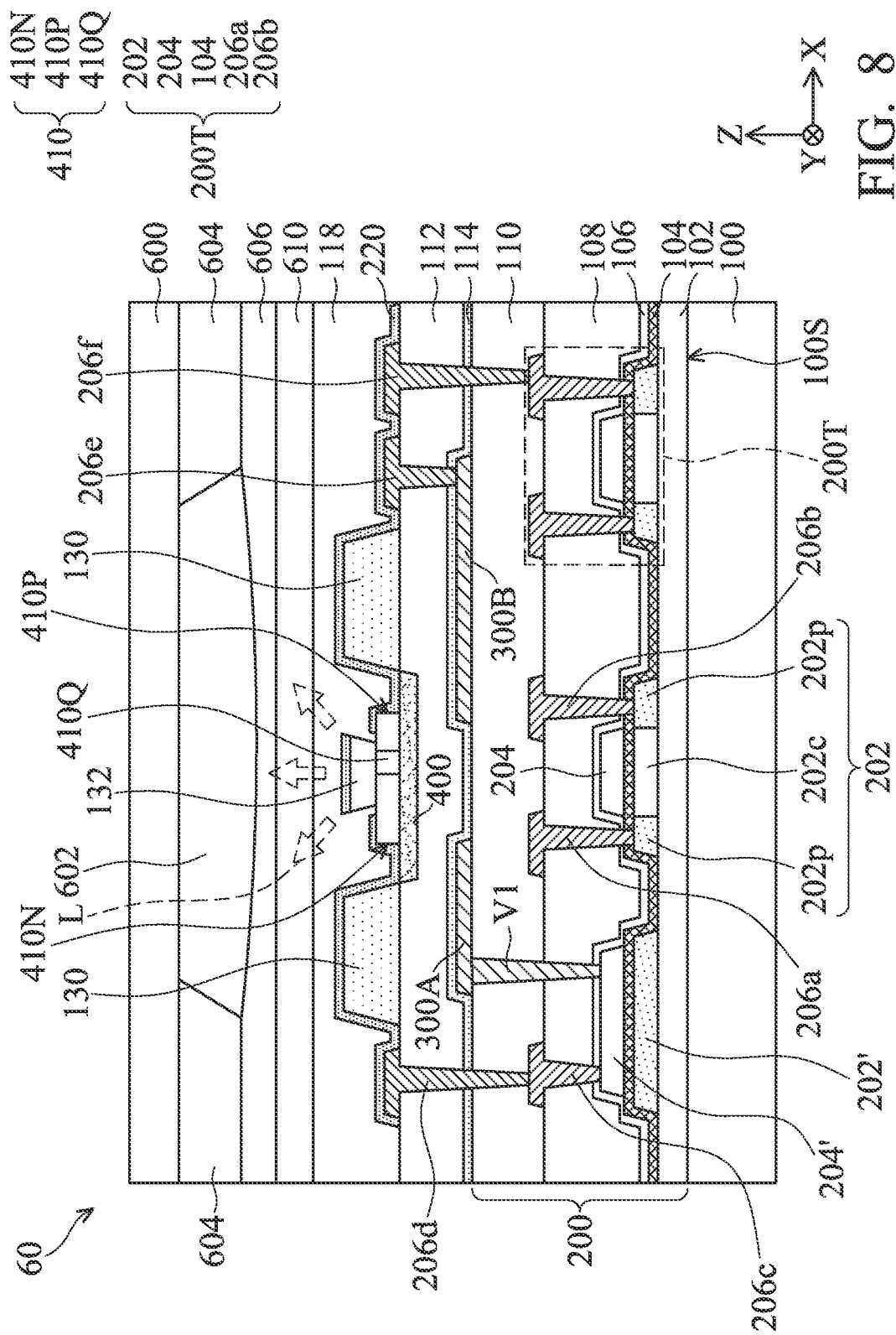
FIG. 8 is a cross-sectional diagram of a display device in accordance with some embodiments of the present disclosure.

Next, refer to FIG. 8, which is a cross-sectional diagram of a display device 60 in accordance with some other embodiments of the present disclosure. The display device 60 shown in FIG. 8 is substantially the same as the display device 50 shown in FIG. 7. The difference between them includes that the light-shielding element 400 of the display device 60 is not disposed between the alignment electrodes 300A and 300B and the light-emitting element 410 in the form of a layer. In this embodiment, the light-shielding element 400 is disposed corresponding to the light-emitting element 410. That is, in the normal direction of the substrate 100, the light-shielding element 400 and the light-emitting element 410 at least partially overlap. Specifically, in the normal direction of the substrate 100 (for example, the Z direction in the drawing), the light-shielding element 400 at least partially overlaps the thin-film transistor 200T and the light-emitting element 410. In addition, the light-shielding element 400 can block the light L emitted from the light-emitting element 410 from irradiating the thin-film transistor 202T, so that the probability of abnormality occurring in the thin-film transistor 202T can be reduced.

Figure 9:
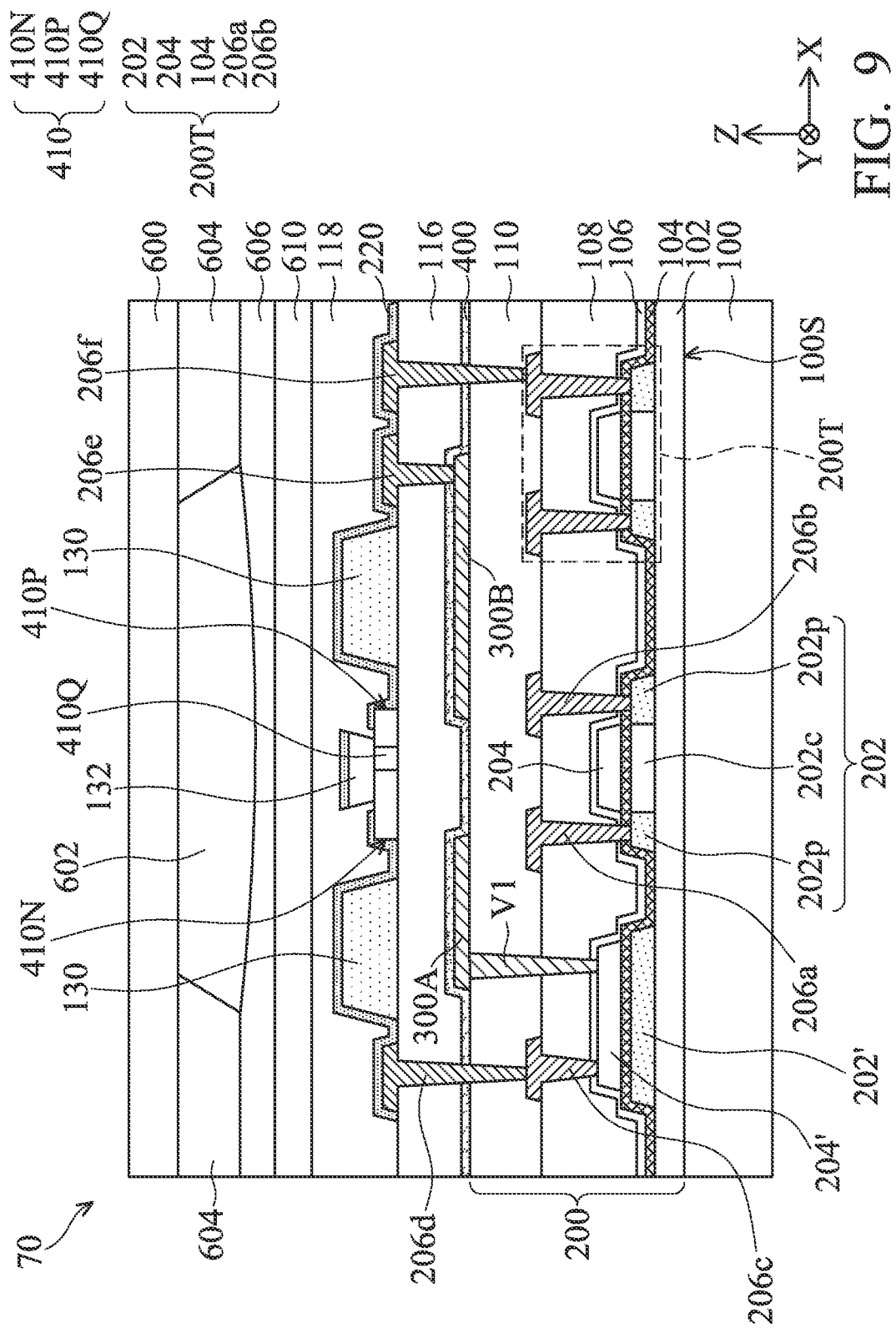
FIG. 9 is a cross-sectional diagram of a display device in accordance with some embodiments of the present disclosure.

Next, refer to FIG. 9, which is a cross-sectional diagram of a display device 70 in accordance with some other embodiments of the present disclosure. The display device 70 shown in FIG. 9 is substantially the same as the display device 50 shown in FIG. 7. The difference between them includes that the light-shielding element 400 in the display device 70 is conformally formed on the insulating layer 110, the alignment electrode 300A and the alignment electrode 300B. That is, the light-shielding element 400 undulates along the profile of the alignment electrode 300A and the alignment electrode 300B. In this embodiment, the light-shielding element 400 is disposed between the insulating layer 110 and the insulating layer 116, and does not serve as a planarization layer.

Next, refer to FIG. 10, which is a cross-sectional diagram of a display device 80 in accordance with some other embodiments of the present disclosure. The display device 80 shown FIG. 10 is substantially the same as the display device 50 shown in FIG. 7. The difference between them includes that the light-shielding element 400 in the display device 80 is a conductor, and the display device 80 further includes an insulating layer 114'. The insulating layer 114' can electrically isolate the light-shielding element 400 from the conductive element 206d, the conductive element 206e, and the conductive element 206f.

Specifically, in this embodiment, the material of the light-shielding element 400 may include a light-absorbing material, and the light-shielding element 400 may be a conductor. In this embodiment, the light-shielding element 400 may be, for example, a black matrix. The material of the light-shielding element 400 may include black photoresist material, black printing ink, black resin, other suitable materials, or a combination thereof, but it is not limited thereto. In addition, the material of the light-shielding element 400 may further include a conductive material. For example, the conductive material may include titanium, carbon, other suitable conductive materials, or a combination thereof, but it is not limited thereto. Furthermore, in this embodiment, since the light-shielding element 400 includes a conductive material, the light-shielding element 400 can include a reflective structure and a light-absorbing structure at the same time.

In addition, the material of the insulating layer 114' is similar to those of the aforementioned insulating layer 106, the insulating layer 108, and the insulating layer 110, and thus will not be repeated here.

Furthermore, in this embodiment, the thickness of the light-shielding element 400 may be in a range from 0.01 micrometer (μm) to 10 μm, or in a range from 0.1 μm to 5 μm, for example, 0.2 μm or 2 μm, but it is not limited thereto.

To summarize the above, in some embodiments of the present disclosure, the provided display device includes the light-shielding element disposed between the light-emitting element and the thin-film transistor, and the light-shielding element can block the light emitted from the light-emitting element from irradiating the thin-film transistor. Therefore, the risk of photocurrent or abnormality occurring in the thin-film transistor caused by light leakage can be reduced.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A display device, comprising:
   a substrate having a surface;
   a driving layer comprising a thin-film transistor, wherein the thin-film transistor is disposed on the surface;
   a light-emitting element having a P-end and an N-end, wherein the light-emitting element is disposed on the driving layer and arranged in such a way that a virtual line connecting the P-end and the N-end is parallel to the surface;
   a light-shielding element disposed between the light-emitting element and the thin-film transistor for blocking a light emitted from the light-emitting element from irradiating the thin-film transistor; and
   a pair of alignment electrodes for aligning the light-emitting element, wherein the light-shielding element is conformally formed on the pair of alignment electrodes.

2. The display device as claimed in claim 1, wherein the light-shielding element partially overlaps the pair of alignment electrodes.

3. The display device as claimed in claim 1, wherein there is a gap between the pair of alignment electrodes, and the light-shielding element at least partially overlaps the gap.

4. The display device as claimed in claim 1, wherein the pair of alignment electrodes are disposed on the driving layer.

5. The display device as claimed in claim 4, wherein the light-shielding element is a conductor.

6. The display device as claimed in claim 5, wherein the pair of alignment electrodes are closer to the light-emitting element than the light-shielding element.

7. The display device as claimed in claim 4, wherein the light-shielding element is an insulator.

8. The display device as claimed in claim 7, wherein the light-shielding element is closer to the light-emitting element than the pair of alignment electrodes.

9. The display device as claimed in claim 7, wherein the light-shielding element has a distributed Bragg reflector (DBR) structure.

10. The display device as claimed in claim 1, wherein the light-shielding element at least partially overlaps the thin-film transistor and the light-emitting element.

11. The display device as claimed in claim 1, further comprising an insulating layer disposed on the light-shielding element, wherein the light-emitting element is disposed in a trench defined by the insulating layer.

12. The display device as claimed in claim 11, wherein the insulating layer serves as a pixel define layer of the display device.

13. The display device as claimed in claim 1, wherein the light-emitting element further comprises a quantum well region located between the P-end and the N-end.

14. The display device as claimed in claim 1, wherein the light-emitting element is mixed in a solution.

15. The display device as claimed in claim 1, further comprising an insulating layer disposed on the thin-film transistor, wherein the insulating layer comprises a recess, and the light-shielding element is disposed in the recess.

16. The display device as claimed in claim 15, wherein a thickness of the light-shielding element disposed in the recess is variable.

17. The display device as claimed in claim 16, wherein the recess has a side surface, the light-shielding element on the side surface has a first thickness at a position closer to the light-emitting element, the light-shielding element on the side surface has a second thickness at a position farther from the light-emitting element, and the first thickness is smaller than the second thickness.

18. The display device as claimed in claim 1, wherein the light-shielding element is disposed corresponding to the light-emitting element.

* * * * *